United States Patent [19]
Basile et al.

[11] Patent Number: 5,418,573
[45] Date of Patent: May 23, 1995

[54] APPARATUS AND METHOD FOR PRODUCING PERIODIC SYNCHRONIZATION REFERENCES FORMING A SYNCHRONIZATION SIGNAL

[75] Inventors: Carlo Basile, Ossining; Samuel O. Akiwumi-Assani, Beacon; Viktor L. Gornstein, New York City, all of N.Y.

[73] Assignee: Philips Electronics North America Corporation, New York, N.Y.

[21] Appl. No.: 95,980

[22] Filed: Jul. 22, 1993

[51] Int. Cl.⁶ .............................................. H04N 5/04
[52] U.S. Cl. ................................... 348/536; 348/537; 348/525
[58] Field of Search ................ 358/148, 149, 158, 150, 358/153, 154; H04N 5/04; 331/14, 17, 20, 18; 348/500, 521, 524, 536, 537, 547, 540, 548, 541, 542, 543, 544, 525

[56] References Cited

U.S. PATENT DOCUMENTS

| | | | |
|---|---|---|---|
| 4,461,999 | 7/1984 | Wolf et al. | 348/536 |
| 4,733,197 | 3/1988 | Chow | 358/158 |
| 4,802,009 | 1/1989 | Hartmeier | 348/524 |
| 4,812,783 | 3/1989 | Honjo et al. | 348/537 |
| 4,954,893 | 9/1990 | Urakami | 358/153 |
| 4,974,081 | 11/1990 | Yokogawa | 358/158 |
| 5,005,079 | 4/1991 | Aatomi | 348/524 |
| 5,181,115 | 1/1993 | Flamm et al. | 358/148 |

*Primary Examiner*—James J. Groody
*Assistant Examiner*—Michael H. Lee
*Attorney, Agent, or Firm*—Richard A. Weiss

[57] ABSTRACT

An apparatus, such as an adaptive flywheel, and method for producing periodic time references, forming a periodic time reference signal, from uncertain time references. A counter counts from a first count value to a second count value and provides a periodic time reference each time its count reaches the second count value. An error processing device, coupled to the counter, determines (a) whether an uncertain time reference is received within a predetermined range of count values (corresponding to a window of expectation), or (b) whether the absolute value of the average of an error, corresponding to the number of increment values before or after the second count value, whichever is lower, the count is at when an uncertain synchronization reference is received, and at least one previously determined error for at least one previously received uncertain synchronization reference is greater than WC/2 increment values. The error processing device causes the counter to reset the count to the first count value when, with respect to (a), an uncertain time reference is received when the count is at a count value other than one in the range of predetermined count values, and with respect to (b), the absolute value of the average error is greater than a predetermined number of (i.e., WC2) increment values.

19 Claims, 8 Drawing Sheets

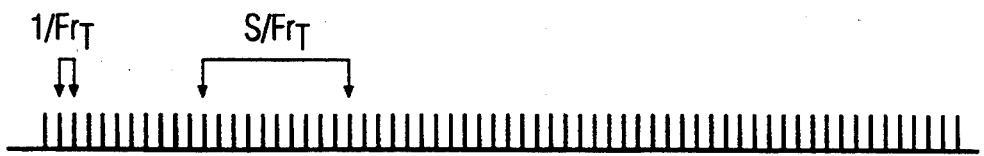

ORIGINAL FREQUENCY REFERENCE SIGNAL GENERATED BY TRANSMITTER (FREQUENCY = $Fr_T$)

FIG. 1a

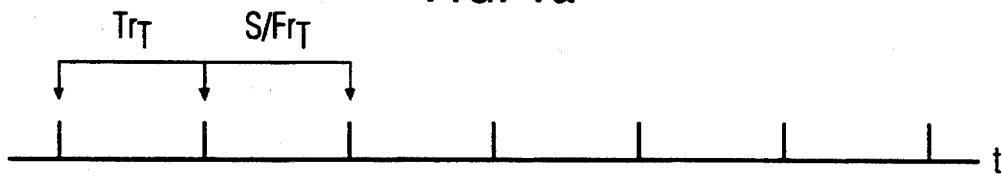

ORIGINAL PERIODIC TIME REFERENCE SIGNAL GENERATED BY TRANSMITTER
(PRIOR TO COMPRESSION AND PACKETIZING) (PERIODIC TIME REFERENCES) (PERIOD = $Tr_T$)

FIG. 1b

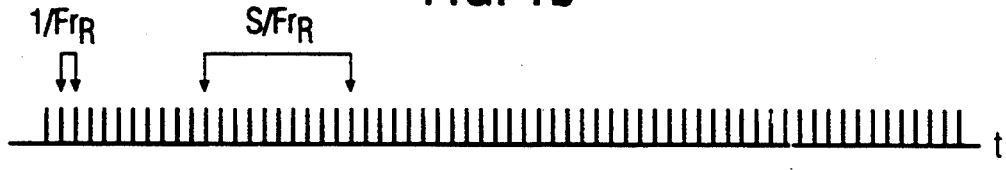

FREQUENCY REFERENCE SIGNAL OBTAINED BY RECEIVER (FREQUENCY = $Fr_R = Fr_T$)

FIG. 1c

UNCERTAIN TIME REFERENCES RECEIVED BY RECEIVER

FIG. 1d

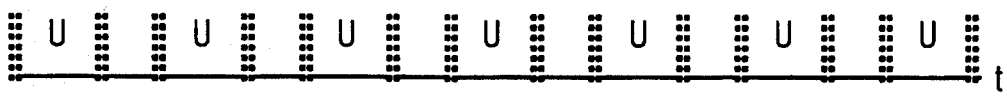

PERIODIC INTERVALS OF TIME UNCERTAINTY

FIG. 1e

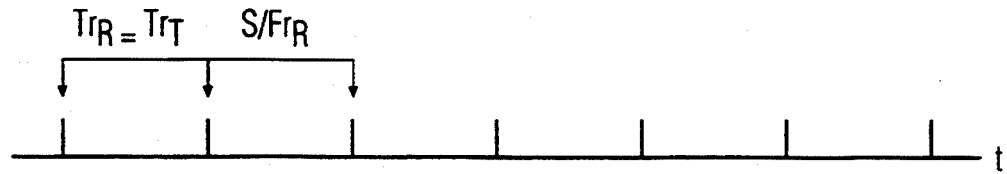

PERIODIC TIME REFERENCES PRODUCED BY ADAPTIVE FLYWHEEL
FORMING PERIODIC TIME REFERENCE SIGNAL (PERIOD = $Tr_R = Tr_T$)

FIG. 1f

APPARATUS AND METHOD FOR PRODUCING PERIODIC SYNCHRONIZATION REFERENCES FORMING A SYNCHRONIZATION SIGNAL

BACKGROUND OF THE INVENTION

1. Field of the Invention

The present invention relates to an apparatus and method for producing a synchronization signal. In particular, the present invention relates to an apparatus, such as an adaptive flywheel, and method for producing periodic synchronization references, forming a synchronization signal, from synchronization references following one another with some time uncertainty (such synchronization references, i.e., ones which follow one another with some time uncertainty, are hereinafter referred to as "uncertain synchronization references").

2. Description of Related Art

Flywheels have previously been used in many fields to aid in the recovery of periodic signals used in the synchronization of information processing. One such field is the field of digital television.

A digital television image is made up of p pixels which are arranged in lines of adjacent pixels (for example, an image having $1.575 \times 10^6$ pixels may have 1050 lines of 1500 adjacent pixels each). When these p pixels are illuminated in accordance with digital video information in the proper time sequence and order, an image is displayed. Typically, these p pixels are illuminated one after the other, line after line. Digital video information for each of the p pixels is contained in a frame. (Hence, for the example provided above, there would be $1.575 \times 10^6$ pixels/frame.)

At the receiver of any digital television system, at least two synchronization signals are required for digital television synchronization, i.e., synchronization of digital video information processing and image display. Such synchronization signals can include a frequency reference signal, which is always periodic (i.e., references occur at regular intervals with respect to one another), and a periodic time reference signal. When these two periodic signals are obtained by a digital television receiver, they can be used to derive all of the synchronization signals required for digital television synchronization (e.g., clock, frame, field, horizontal, audio, etc.) and, in turn, can be used to properly synchronize digital video information processing and image display.

A frequency reference signal is a periodic signal having a frequency Fr which is related to the pixel frequency Fp of a frame by some rational number m/n, where m and n are integers. Possible frequency reference signals can include the horizontal, i.e., line, frequency (for the example provided above, n/m=1500), the pixel frequency Fp (for the example provided above, n/m=1) or the frequency of a group of gp pixels, where gp is an integer, or a fraction of a pixel.

A periodic time reference signal is a periodic signal having a period Tr which is equal to S frequency reference signal periods, i.e., Tr=S/Fr, where S is an integer. Possible periodic time reference signals can include the frame rate (for the example provided above, $S=1.575 \times 10^6$) or the rate of a group of gf frames, where gf is an integer (for the example provided above, $S=gf \times 1.575 \times 10^6$).

In the prior art, flywheels are used to aid in the recovery of a periodic time reference signal when one or more portions, i.e., one or more time references, of an original periodic time reference signal generated by a digital television transmitter is not received by a digital television receiver. Such references are not received because they are either lost, primarily due to some destablizing factor of a telecommunication or transmission line or delivery media (e.g., clouds, aircraft, lightning or other form of interference), or not transmitted.

Prior art flywheels, consisting of a counter and, in certain instances, a logic element, aid in the recovery of a periodic time reference signal by generating a new time reference at the appropriate time in place of a lost or nontransmitted periodic time reference. Such flywheels, however, can only be used to recover lost or non-transmitted time references of a periodic time reference signal (i.e., in the case of lost time references, periodic except for lost time references) received thereby. If a time reference signal received by a prior art flywheel is not periodic (except for lost time references), that flywheel cannot be used to recover lost or non-transmitted time references which would result in the recovery of a periodic time reference signal.

In modern digital television systems, digital data (including digital video information) is compressed by different compression methods, usually involving variable length coding ("VLC"), prior to being transmitted by a digital television transmitter. Such compressed digital data has a variable length and is transmitted in the form of digital data packets. The time at which successive time references are transmitted is a function of the compressed digital data length and digital data packetizing. As a result, a periodic time reference signal loses its periodicity prior to being transmitted, and its once periodic time references are received by a digital television receiver one after the other with some time uncertainty. (Time references which follow one another with some time uncertainty are hereinafter referred to as "uncertain time references".) Such time uncertainty may be equal to, for example, the transmission time of two digital data packets.

Uncertain time references cannot be used by prior art flywheels to produce a periodic time reference signal. Without such a periodic signal, digital television synchronization becomes near impossible.

Prior to the present invention, there was no known apparatus or method for utilizing uncertain time references to produce a periodic time reference signal for use in digital television synchronization. For that matter, there was no known apparatus or method for using uncertain synchronization references to produce a synchronization signal.

SUMMARY OF THE INVENTION

It is an objective of the present invention to use uncertain synchronization references to produce a synchronization signal, thereby making it possible to produce periodic time references, forming a periodic time reference signal, from uncertain time references. This objective is achieved by using an apparatus, such as an adaptive flywheel, together with uncertain synchronization references and a periodic input signal whose period is integrally related to the period of the synchronization signal which is to be produced. Such an apparatus comprises a counter and an error processing device.

The counter of the present invention receives the periodic input signal and counts, repeatedly, from a first count value to a second count value by an increment value for each period of the periodic input signal it receives. Upon reaching the second count value, the counter resets its count to the first count value and produces a periodic synchronization reference. The periodic synchronization references provided by the counter form the synchronization signal being produced.

The error processing device of the invention is coupled to the counter. In one embodiment, the error processing device detects whether an uncertain synchronization reference is received within a window of expectation. The window of expectation corresponds to a range of predetermined count values. If an uncertain synchronization reference is received when the count of the counter is at a count value other than one of the count values in the range of predetermined count values, the error processing device sends a reset signal to the counter causing the count to reset to the first count value. However, if an uncertain synchronization reference is received when the count of the counter is at a count value which is in the range of predetermined count values, the error processing device does not send a reset signal to the counter.

In another embodiment of the present invention, the error processing device determines an error corresponding to the number of increment values before or after the second count value, whichever has a smaller absolute value, the count is at when an uncertain synchronization reference is received. One sign is used to indicate the number of increment values before the second count value, and the opposite sign is used to indicate the number of increment values after the second count value. If the absolute value of an average of an error determined for the uncertain synchronization reference received and at least one previously determined error for at least one previously received uncertain synchronization reference is greater than a predetermined number of (i.e., WC/2) increment values, the error processing device sends a reset signal to the counter causing the count to reset to the first count value. Otherwise, no reset signal is sent to the counter.

When the error processing device sends a reset signal, the count of the counter will not reach the second count value and no periodic synchronization reference will be produced. However, when the error processing device does not send a reset signal, the count of the counter will reach the second count value, and a periodic synchronization signal will be produced.

When the error processing device first produces a periodic synchronization reference, stability is reached, i.e., production of periodic synchronization references is continuous, unless a channel change occurs or either uncertain synchronization references or the periodic input signal is lost. The reason for this is that each succeeding uncertain synchronization reference either will fall within the window of expectation or an average error will be determined therefor which is less than or equal to WC/2 increment values.

The above-mentioned objective can be achieved by performing the following steps comprising a method of the present invention: (a) counting from a first count value to a second count value by an increment value for each periodic input signal period received, and resetting the count to the first count value when the count reaches the second count value; (b) detecting whether an uncertain synchronization reference is received when the count is at a count value other than one of a range of predetermined count values (corresponding to a window of expectation), and resetting the count to the first count value if the uncertain synchronization reference is received when the count is at a count value other than one of the range of predetermined count values; and (c) providing a periodic synchronization reference when the count reaches the second count value. The periodic synchronization references forming the periodic synchronization signal.

The same objective can also be achieved through an additional method involving the following steps: (a) counting from a first count value to a second count value by an increment value for each periodic input signal period received, and resetting the count to the first count value when the count reaches the second count value; (b) determining an error corresponding to the number of increment values before or after the second count value, whichever has a smaller absolute value, the count is at when an uncertain synchronization reference is received (one sign being used to indicate the number of increment values before the second count value and the opposite sign being used to indicate the number of increment values after the second count value), and resetting the count to the first count value if an average of the error determined for the uncertain synchronization reference received and at least on previously determined error for at least one previously received uncertain synchronization reference is greater than a a predetermined number of (i.e., WC/2) increment values; and (c) providing a periodic synchronization reference when the count reaches the second count value. The periodic synchronization references again forming the periodic synchronization signal.

BRIEF DESCRIPTION OF THE DRAWINGS

The invention will now be described in greater detail with reference to the following illustrative drawings, in which:

FIGS. 1a–f show frequency and periodic time reference signals generated by a digital television transmitter and obtained or received by a digital television receiver, uncertain time references and periodic intervals of time uncertainty;

DESCRIPTION OF THE PREFERRED EMBODIMENTS

Figure 2:
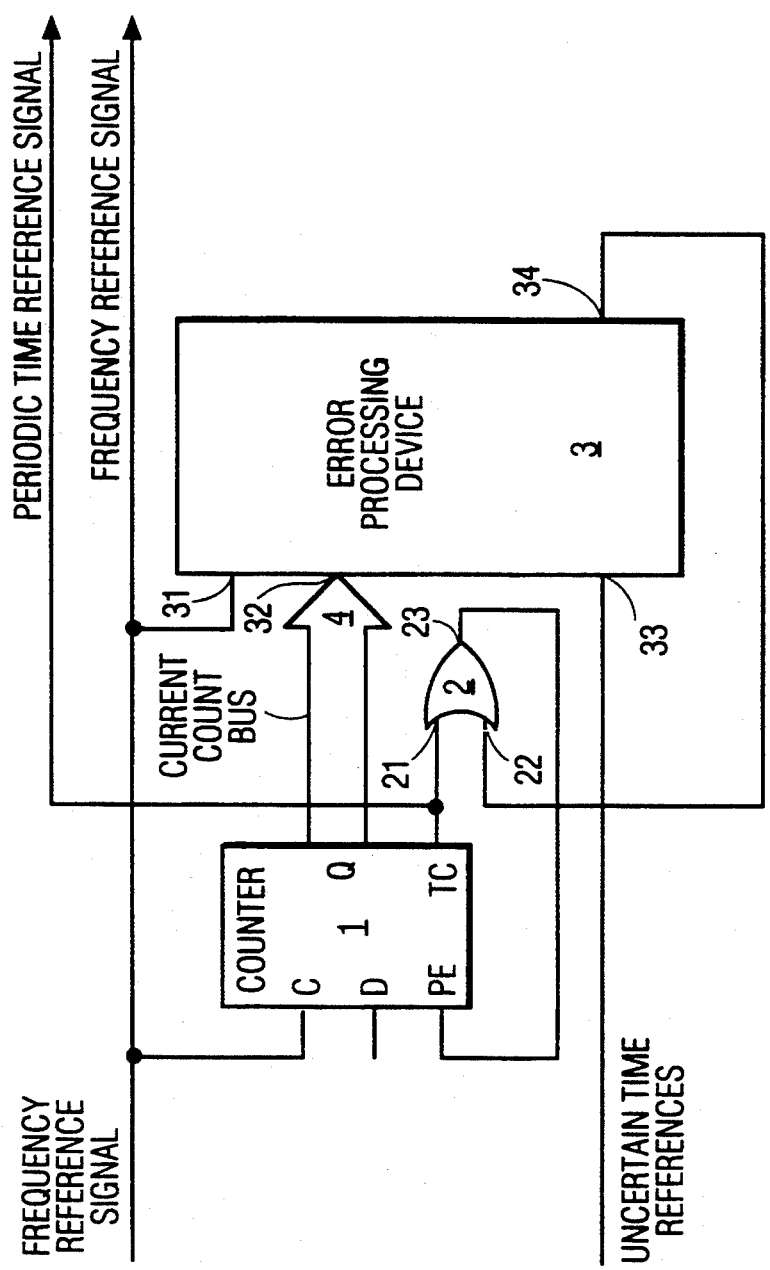
FIGS. 2 and 7 are block diagrams of adaptive flywheels in accordance with the present invention.

It has been found that uncertain time references can be used together with an integrally related frequency reference signal to produce a periodic time reference signal. Because of this, modern digital television receivers which receive uncertain time references instead of a periodic time reference signal can still effect proper television synchronization.

A digital television transmitter generates both a frequency reference signal (which is periodic), having a frequency $Fr_T$, and a periodic time reference signal, having a period $Tr_T$. The period $Tr_T$ of the periodic time reference signal generated is equal to $S/Fr_T$, where $1/Fr_T$ is the period of the frequency reference signal generated and S is an integer. See Figs. 1a and 1b.

With the use of VLC and packetizing, a once periodic time reference signal losses it periodicity prior to transmission, which causes a digital television receiver to receive uncertain time references. See FIG. 1d. The use of VLC and packetizing does not effect the frequency reference signal obtained by a digital television receiver; and, hence, the frequency reference signal obtained by the digital television receiver has a frequency of $Fr_R$, where $Fr_R$ is equal to $Fr_T$. See FIGS. 1a and 1c.

For proper television synchronization to occur, a digital television receiver requires a periodic time reference signal having a period $Tr_R$ which is equal to the period $Tr_T$ of the original periodic time reference signal generated by a digital television transmitter (i.e., prior to its compression, packetizing and transmission), so that $Tr_R$ is equal to $S/Fr_R$. See FIGS. 1b, 1c and 1f. Production of such a periodic time reference signal involves producing a time reference (i.e., a periodic time reference) every S periods of the frequency reference signal, i.e., $S/Fr_R$. See FIGS. 1c and 1f.

Uncertain time references follow one another a periodically but within known periodic time intervals U of time uncertainty (such intervals are hereinafter referred to as "time intervals U"). See FIGS. 1d and 1e. The uncertain time references occur randomly within the time intervals U, with one uncertain time reference occurring within each time interval U. The value of U is a function of the compression and packetizing of digital data by a digital television transmitter and, as such, is a digital television system parameter known to persons skilled in the art.

With the value of U known, it is possible to select a window of expectation W, where $W \geq U$, such that each and every next uncertain time reference can be expected to be received by the digital television receiver within the window of expectation, and more particularly an ideal situation, between times $(S/Fr_R)-(W/2)$ and $(S/Fr_R)+(W/2)$ measured from a periodic time reference produced by the apparatus of the present invention. Based on this relationship, and the aforementioned relationship between the period $Tr_R$ and the frequency $Fr_R$, i.e., $Tr_R=S/Fr_R$, it is possible to produce a proper periodic time reference signal from uncertain time references and an integrally related frequency reference signal obtained by a digital television receiver. This is achieved by determining how many periods of the frequency reference signal have been received prior to the instant at which an uncertain time reference is received in conjunction with whether that uncertain time reference is received within (or outside) the window of expectation.

FIG. 2 shows an adaptive flywheel capable of producing periodic time references and, in turn, a periodic time reference signal from received uncertain time references in accordance with the present invention. The adaptive flywheel of FIG. 2 comprises a counter 1, a logic element (e.g., OR gate 2) and an error processing device 3.

The counter 1 counts from a first count value to a second count value by an increment value. In a preferred embodiment, the first count value is a minimum count value, the second count value is a maximum count value and the increment value is one. Nevertheless, it is possible for the first count value to be a maximum count value, and the second count value to be a minimum count value. (Although the description herein pertains to the former, it applies equally with respect to the latter, with appropriate changes, which persons skilled in the art would be aware of, being made.)

In the preferred embodiment, the counter 1 is an L-bit binary counter capable of counting from a minimum value of $2^L-S$ to a maximum value of $2^L-1$. L is the minimum number of bits necessary to represent S in binary form. In other words, $L \geq \ln_2 S$, where L is the lowest integer greater than $\ln_2 S$.

The counter 1 has three inputs. The first of these is a clock input C which receives the frequency reference signal. In the preferred embodiment, the frequency reference signal is the pixel frequency of the digital images being transmitted, i.e., $Fr_R=Fp$. Each time the counter 1 receives an indication that another frequency reference signal period has occurred, it increases its count by the increment value.

The second input of the counter 1 is a parallel enable input PE (i.e., a reset enable) which receives a reset signal causing the count of the counter 1 to reset to its minimum count value upon the next indication of another frequency reference signal period having occurred. The minimum count value is received by the counter 1 through its third input, a data input D.

Counter 1 also has two outputs. The first of these is a data output Q which provides the current count of the counter 1, via a current count bus 4, to an input 32 of the error processing device 3. The second counter output is a terminal count output TC which provides a signal when the count in the counter reaches the maximum count value. Each time the terminal count output TC of the counter 1 provides a signal, that signal acts as a periodic time reference (of the periodic time reference signal to be produced by the adaptive flywheel).

The terminal count output TC of the counter 1 is connected to a first input 21 of the OR gate 2. The other input of the OR gate 2, an input 22, is coupled to an output 34 of the error processing device 3. The output 23 of the OR gate 2 is coupled to the parallel enable input PE of the counter 1. The OR gate 2 operates so as to provide the parallel enable input PE of the counter 1 with a reset signal when a signal is provided at either the terminal count output TC of the counter 1 or at the output 34 of the error processing device. Thus, when terminal count output TC of counter 1 provides a signal, the count of the counter 1 is reset to the minimum count value.

In addition to the input 32, the error processing device 3 also includes two additional inputs. One of those is an input 31 which receives the frequency reference signal. The other is an input 33 which receives uncertain time references.

When the error processing device 3 first receives an uncertain time reference, it loads the current count of the counter 1 through its input 32. It then compares the current count to a range of predetermined count values which include certain of the count values between and including the minimum and maximum count values (see FIG. 3a) and which correspond to the window of expectation W. If the current count is a count value which is not in the range of predetermined count values, then the uncertain time reference has been received outside the window of expectation W; however, if the current count is a count value which is in the range of predetermined count values, then the uncertain time reference has been received within the window of expectation W.

If the error processing device 3 determines that an uncertain time reference is received outside the window expectation, it generates a signal at its output 34, which, in turn, causes output 23 of the OR gate 2 to provide a reset signal. At the next indication of another frequency reference signal period having occurred, the count of the counter 1 is reset to the minimum count value. In this case, the counter 1 will not reach the maximum count value, and no periodic time reference will be produced.

If the error processing device 3 determines that an uncertain time reference is received within the window of expectation, no signal is provided at output 34 of the error processing device 3. In this case, the count of the counter 1 is not reset and will eventually reach the maximum count value, and a periodic time reference will be produced.

When the error processing device 3 first receives an uncertain time reference which is within the window of expectation W, each succeeding uncertain time reference will also fall within the window of expectation W, unless a channel change occurs or either uncertain time references or the frequency reference signal is lost, and stability is reached (i.e., continuous production of periodic time references). This is the case because the window of expectation W has been selected such that it is greater than or equal to the time interval U, i.e., $W \geq U$.

As can be seen from this discussion, the aim of the error processing device 3 is to continue to reset the count in the counter 1 until the correct number of frequency reference signal periods are received between each uncertain time reference. This results in stability.

FIG. 3a shows a smoothed representation of the count of the counter 1 counting from a minimum count value to a maximum count value over time; FIG. 3b shows when uncertain time references are received by a digital television receiver with respect to the window of expectation W over time; FIG. 3c shows when the error processing device 3 provides a signal at its output 34 (i.e., "a reset output signal") over time; and FIG. 3d shows when a periodic time reference signal is produced by the counter 1 over time.

In both the positive and negative error cases identified in FIG. 3a, an uncertain time reference is received within the window of expectation W. See $UTR_{POS}$ and $UTR_{NEG}$ in FIG. 3b. Thus, no reset output signal is provided by the error processing device 3, and the counter 1 is allowed to count up to the maximum count value. Upon reaching the maximum count value, the count of the counter 1 is reset to the minimum count value (see $R_{POS}$ and $R_{NEG}$ in FIG. 3a), and it simultaneously produces a periodic time reference signal (see $Ref_{POS}$ and $Ref_{NEG}$ in FIG. 3d).

Both of those time reference, i.e., $Ref_{POS}$ and $Ref_{NEG}$, and the references which follow thereafter will be periodic. See for example $Ref_{NEXT}$ in FIG. 3d. The reason for this is that stability either exists or is just reached.

However, stability can be interrupted when an uncertain time reference is received outside the window of expectation. See the flywheel reset case of FIG. 3a. Nevertheless, periodic time references will continue to be produced until such time as that uncertain time reference is received. See $Ref_{NEXT}$ in FIG. 3d.

In the flywheel reset case identified in FIG. 3a, an uncertain time reference, identified $UTR_{ERROR}$, is received outside the window of expectation. See FIG. 3b. This causes the error processing device to provide a reset output signal (identified in FIG. 3c as a reset pulse), after a digital delay caused by the processing time of the error processing device 3. The generation of the reset pulse causes the count of the counter 1 to reset to the minimum count value at the instant the reset pulse is provided. See $R_{ERROR}$ in FIG. 3b and the reset pulse in FIG. 3c.

Figure 3:
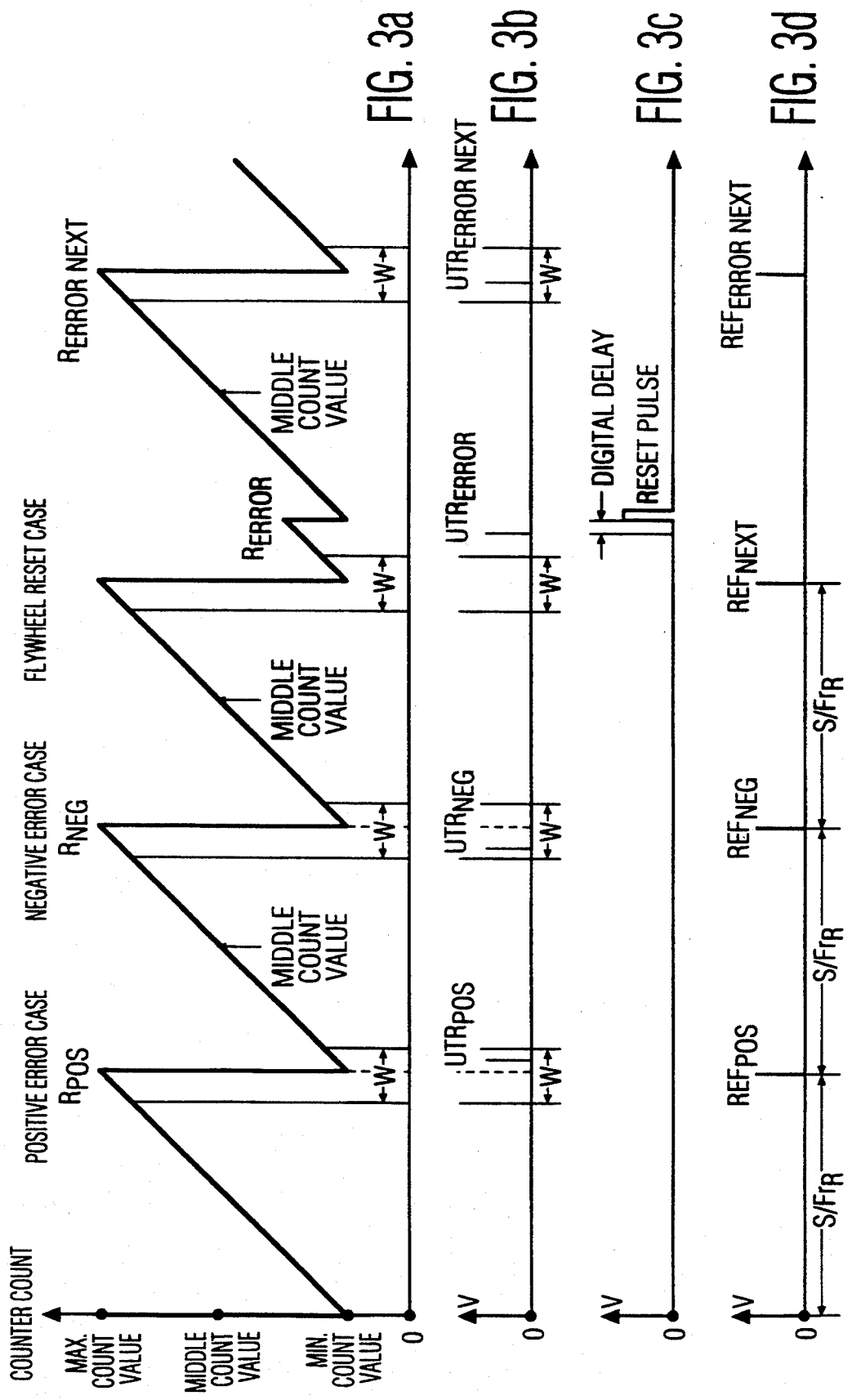
FIGS. 3a–d and 5a–d show timing diagrams of a counter of the present invention, uncertain time references and a reset output signal provided by an error processing device of the present invention.

Because the example shown in FIG. 3 shows the next uncertain time reference, i.e., $UTR_{ERRORNEXT}$, being received within the window of expectation W, the counter 1 counts to it maximum count value, where the count is reset to the minimum count value (see $R_{ERRORNEXT}$ in FIG. 3b), and a periodic time reference is produced (see $UTR_{ERRORNEXT}$ in FIG. 3d). As in the positive and negative error cases, the time references which will follow the produced periodic time reference will be periodic and stability will be reached.

Before discussing the error processing device 3 of FIG. 2 and other embodiments of it in more detail, it is helpful to more clearly understand the relationship between the count values of the counter 1, the frequency reference signal received and the window of expectation W. To begin with, the count values between and including the minimum and the maximum count values each corresponds to a frequency reference signal period (i.e., $1/Fr_R$) received (i.e. one count value exists for a given frequency reference signal period). The total number of count values between and including the minimum and maximum count values is equal to S and corresponds to S frequency reference signal periods (i.e., $S/Fr_R$).

The window of expectation W is equal to a particular number (which is hereinafter denoted "WC") of frequency reference signal periods received. That being the case, it corresponds to a particular number of count values.

Just as there are S count values for S frequency reference signal periods, there are WC count values for WC frequency reference signal periods. Hence, WC is equal to the number of count values corresponding to the window of expectation; or in other words, WC is equal to the number of increment values between an initial count value corresponding to the beginning of the window of expectation W and a final count value corresponding to the end of the window of expectation W.

As mentioned above, the window of expectation W can be chosen in an ideal situation such that each and every next uncertain time reference can be expected to be received by a digital television receiver between times $(S/Fr_R)-(W/2)$ and $(S/Fr_R)+(W/2)$ measured from a periodic time reference produced by the apparatus of the present invention, with that periodic time reference being produced when the count of the counter 1 reaches its maximum count value. That being the case, in an exemplary embodiment, WC is preferably an even integer (i.e., the window of expectation W is chosen so as to include an even number of frequency reference signal periods) and the WC count values have a range (which makes up the range of predetermined count values) which is essentially centered about the maximum count value, and includes the minimum count value, $WC/2-2$ count values (or increment values) immediately above the minimum count value, the maximum count value and $WC/2$ count values (or increment values) immediately below the maximum count value.

In the exemplary embodiment, the count value which is $WC/2$ increment values below the maximum count value is the initial count value corresponding to the beginning of the window of expectation W. The count value which is $WC/2-2$ count values above the minimum count value is a count value which is one increment value below the final count value corresponding to the end of the window of expectation W. The final count value (which is WC/2−1 increment values above the minimum count value) is not included in the range of predetermined count values because it corresponds to the moment at which the window of expectation W ends. See FIG. 8.

For example (See FIG. 8), if the window of expectation W corresponds to 200 frequency reference signal periods, the minimum count value is 0, the maximum count value is 9999, and the increment value is 1, WC would be equal to 200 and the range of WC count values would include the count values of 9899 to 9999 and 0 to 98. Count value 9899 would be the initial count value, which would be included in the range of WC count values, and count value 99 would be the final count value, which would not be included in the range of WC count values.

Figure 8:
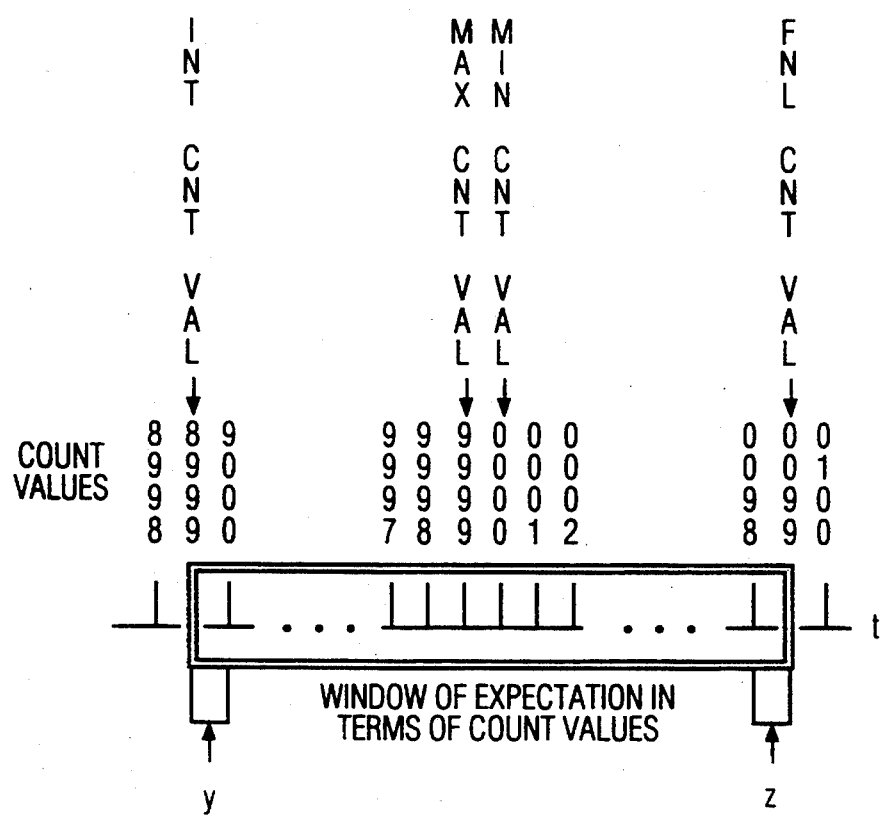
FIG. 8 shows a window of expectation in terms of count values.

With respect to the last point, FIG. 8 illustrates the fact that during a time interval between count values 9899 and 9990 (denoted by reference y) and a time interval between count values 99 and 100 (denoted by reference z.), which each correspond to a frequency reference signal period, only one count value exists for each time interval, i.e., count value 9899 and count value 99, respectively. For this reason, the initial count value is included in the range of WC count values and the final count value is not.

Nevertheless, it should be noted that the range of predetermined count values corresponding to the window of expectation W need not be chosen such that they are symmetrical about the second count value. In addition, in the case in which the window of expectation W is selected such that it corresponds to a very large number of count values, it maybe preferable to select the final count value as being WC/2 increment values above the minimum count value and including it and all of the count values between it and the minimum count value in the range of predetermined count values along with the count values between and including the initial count value (i.e., WC/2 increment values below the maximum count value) and the maximum count value. (It should be noted that this will change the number of count values in the range of predetermined count values corresponding to the window of expectation W to WC+2 count values, instead of WC count value, as discussed above.) Doing this can eliminate the need for additional hardware and software without adversely affecting the operation of the present invention.

The error processing device 3 of FIG. 2 can comprise many different types of circuitry to achieve it objectives of determining whether an uncertain time reference is received within the window of expectation W, and if not, to output a reset output signal. The error processing device 3 can comprise a PROM programmed to determine if the current count received from the counter is equal to one of the range of count values corresponding to the window of expectation W. Error processing device 3 could also employ simple logic elements to perform the same functions.

Figure 4:
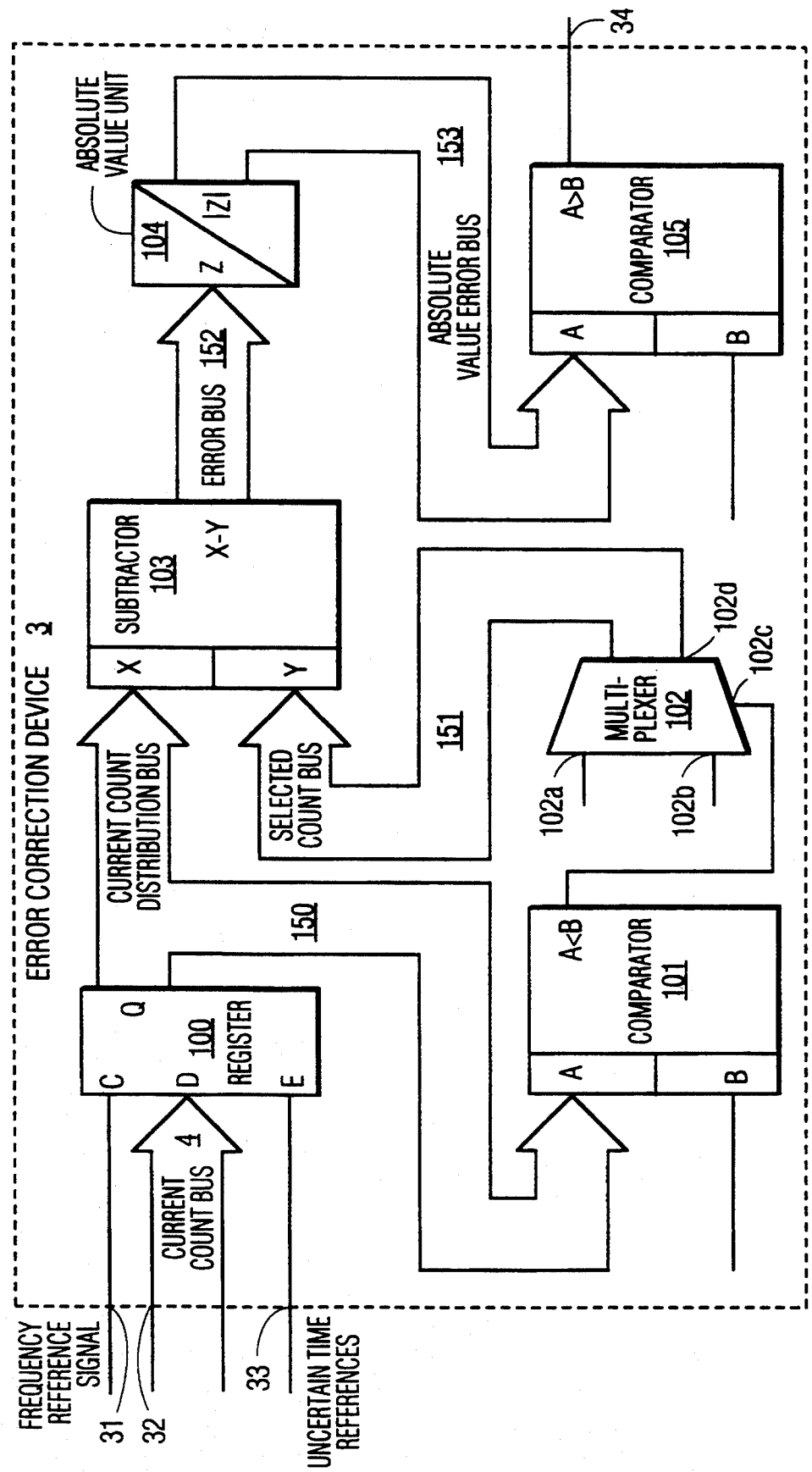
FIGS. 4 and 6 are block diagrams of error processing devices of the present invention.

A preferred embodiment of the error processing device 3 of FIG. 2 is shown in FIG. 4. That embodiment comprises a register 100, two comparators 101 and 105, a multiplexer 102, a subtractor 103 and an absolute value unit 104.

Input 33 of the error processing device 3 is coupled to an enable input E of the register 100 for receiving uncertain time references. When an uncertain time reference is received by the register 100, it obtains the current count of the counter 1 from the current count bus 4, via a data input D, and immediately passes that count to a current count distribution bus 150, via a data output Q. The current count distribution bus 150 is coupled to the subtractor 103, via an input X, and the comparator 101, via an input A, for supplying both with the current count of the counter 1. The register 100 also has a clock input C for receiving the frequency reference signal from input 31 of the error processing device 3.

The purpose of comparator 101 is to determine whether the current count is higher than or lower than a middle count value which substantially corresponds to the middle of the count range of count values between the minimum and maximum count values. Because in a preferred embodiment there are an even number of count values, none of the count values actually corresponds to a value (which is hereinafter referred to as "the middle value") which is exactly at the middle of the range of count values between the minimum and maximum count values (i.e., a count value which is equal (((maximum count value minimum−count value)/2)+minimum count value). Therefore, in the preferred embodiment, the middle count value is selected to be either the count value which is immediately below the middle value or immediately above the middle value. The middle count value can be determined in accordance with the following relationship when there are an even number of count values:

$$\text{middle count value} = max. - \frac{(max. - min. \pm 1)}{2},$$

where max. is the maximum count value and min. is the minimum count value. Once the middle count value has been determined, it is a fixed value.

Comparator 101 makes the above-mentioned determination by comparing the current count to the middle count value and then outputs that result, via an output A<B, to the multiplexer 102, via an input 102c. The middle count value is supplied to the comparator 101 via an input B.

If the current count is less than the middle count value, a positive error has occurred; while if the current count is higher than the middle count, a negative error has occurred. See FIGS. 3a and 3b. Depending upon whether the error is positive or negative, in the exemplary embodiment, the multiplexer 102 will send subtractor 103 either a value which is two increment values below the minimum count value or the maximum count value, respectively. It is to be noted, however, that in the case in which the final count value is made equal to WC/2 increment values and is included in the range of predetermined count values corresponding to the window of expectation W along with the count value between it and the minimum count value (i.e., the range of predetermined count values includes WC+2 count values), the minimum count value is supplied by the multiplexer 102 to subtractor 103 in place of the value which is two increment values below the minimum count value.

Multiplexer 102 has two inputs 102a and 102b for receiving the value which is two increment values below the minimum count value (or the minimum count value where appropriate) and the maximum count value, respectively. Multiplexer 102 outputs the appropriate count value, via an output 102d, to a selected count bus 151 which is coupled to the subtractor 103, via an input Y.

The subtractor 103 subtracts the selected value, i.e. either the value which is two increment values below the minimum count value (or the minimum count value where appropriate) or the maximum count value, from the current count to arrive at what is called the uncertain time reference error (which is hereinafter referred to as "the error"). The error coincides with the number of counts (or increment values) the current count is off, either positive or negative, from (i.e., above or below) the maximum count value, when an uncertain time reference is received. As such, the error corresponds to how few or too many frequency reference signal periods are received when an uncertain time reference is received.

Once the error has been determined, subtractor 103 outputs it, via an output X-Y, to an error bus 152 which provides it to the absolute value unit 104, via an input Z. The absolute value unit 104 takes the absolute value of the error (which is hereinafter referred to as "the absolute error") and outputs it, via an output /Z/, to an absolute value error bus 153. Absolute value error bus 153 supplies the absolute error to comparator 105, via an input A.

The comparator 105 determines whether an uncertain time reference has been received within the window of expectation W by comparing the absolute error to half of the value of WC, i.e., WC/2. The value of WC/2 is received by an input B of the comparator 105. If the absolute error is greater than WC/2, an uncertain time reference has been received outside the window of expectation W, otherwise it has been received within the window of expectation W.

If an uncertain time reference is received outside the window of expectation W (the value of input A is greater than the value of input B), comparator 105 outputs a reset output signal, via an output A>B, to output 34 of the error processing device 3. Otherwise, the comparator 105 does not provide a reset output signal to its output A>B.

FIGS. 5a–d, which are essentially the same as FIGS. 3a–d, respectively, show the relationship between the information depicted in FIGS. 3a–d and S, S/2 (which corresponds to the middle count value), WC/2 and the error. In the positive error case shown in FIG. 5a, an uncertain time reference is received prior to the middle count value, and the error is less than WC/2. In the negative error case shown in FIG. 5a, an uncertain time reference is received after the middle count value, and the error is also less than WC/2. In both of those cases, since the error is less than WC/2, no reset output signal (i.e., reset pulse) is generated by the error processing device 3, and a periodic time reference signal is produced by the counter 1.

Figure 5:
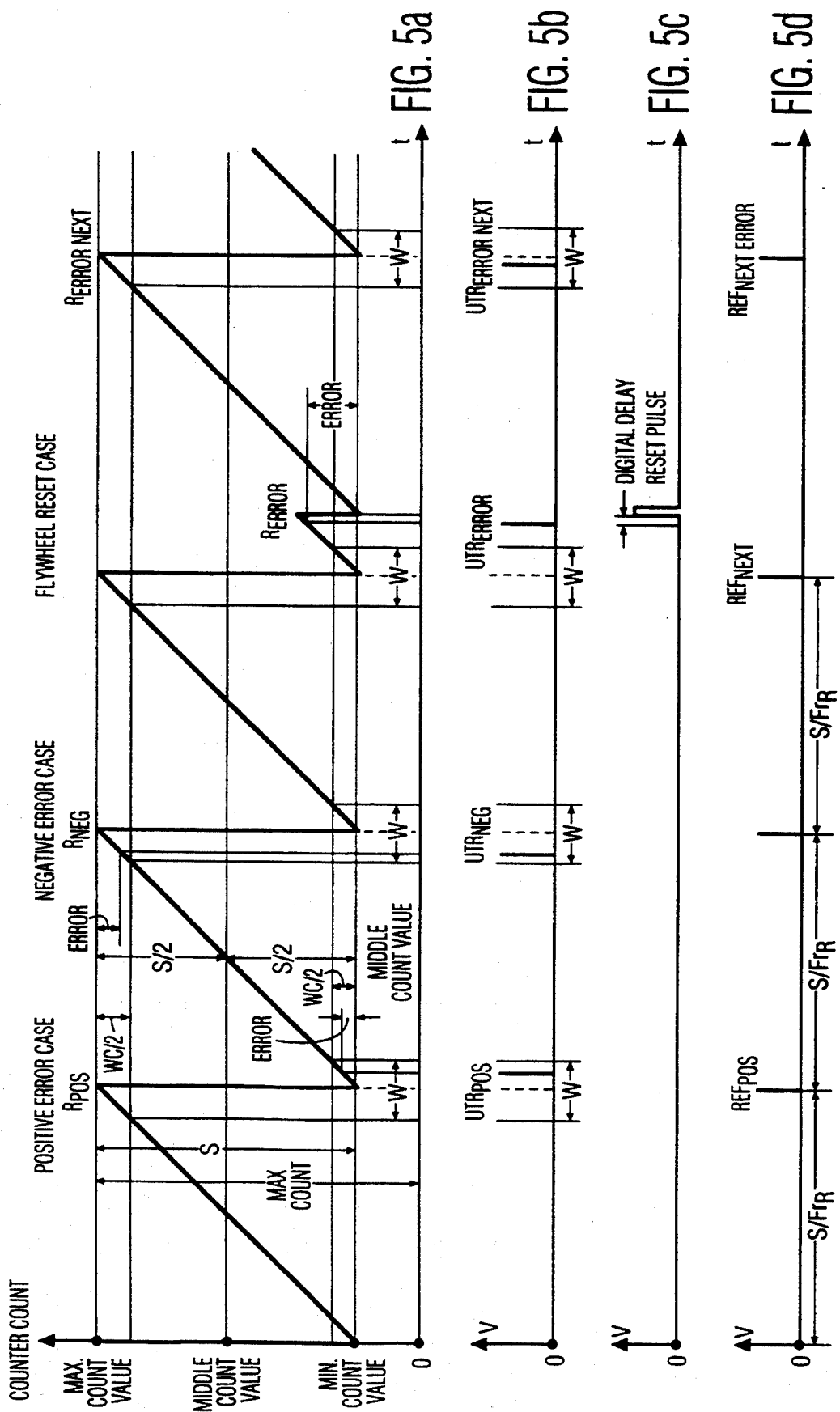

In the flywheel reset case shown in FIG. 5a, an uncertain time reference is received prior to the middle count value, meaning that it is a positive error. However, unlike the positive error case, the error is greater than WC/2 and, therefore, the error processing device 3 generates a reset output signal (i.e., reset pulse), and the count of the counter 1 is reset to its minimum count value. Moreover, no periodic time reference signal is produced.

All of the discussion up to this point has concerned the situation in which the window of expectation W is greater than or equal to the time interval U, i.e., W≧U. Sometimes, nearly all of the uncertain time references follow one another within smaller periodic time intervals of time uncertainty u (such intervals are hereinafter after referred to as "time intervals u"), with only a small percentage of uncertain time references following one another outside the time intervals u.

In addition, it has been found that the larger the window of expectation W chosen, the greater the probability of introducing noise. One solution to this problem is choose a window of expectation W which is equal to the time interval u. However, doing so will result in the adaptive flywheel of FIG. 2 failing to achieve stability, because not every succeeding uncertain time reference will fall within the window of expectation W (i.e., u≦U).

Figure 6:
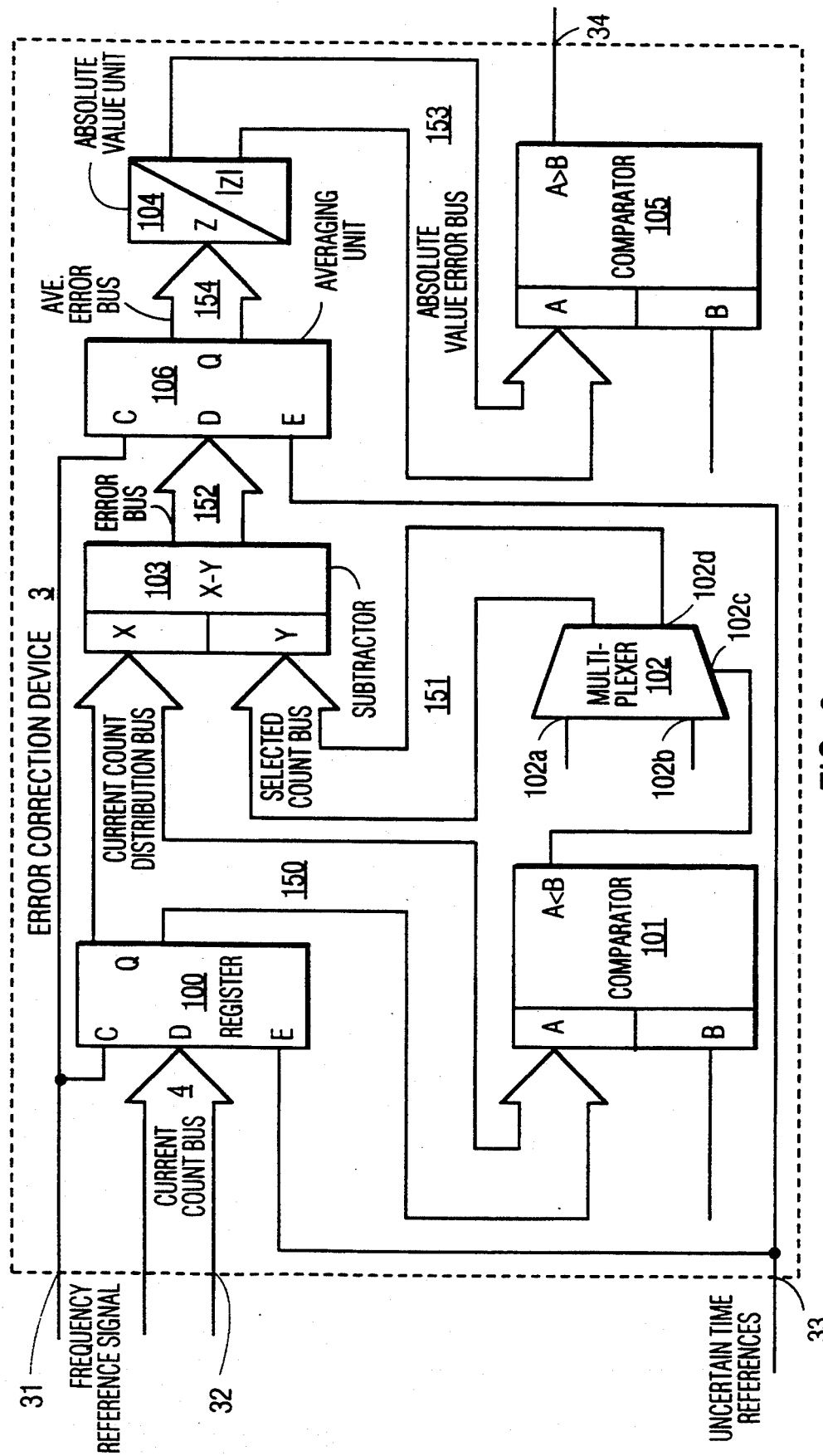

This problem can be solved by adding an averaging unit to the error processing device depicted in FIG. 4. FIG. 6 shows such an embodiment.

FIG. 6 contains each of the elements contained in FIG. 4. However, FIG. 6 also includes an averaging unit 106 which is coupled between the error bus 152 and the absolute value unit 104. The averaging unit 106 receives the error from the error bus 152, via a data input D. The averaging unit 106 also has a clock input C for receiving the frequency reference signal and an enable input E for receiving uncertain time references.

Averaging unit 106 takes the errors determined for x (an integer) previous uncertain time references (e.g., the past 4) and the error determined for a current uncertain time reference, averages them together and outputs an average error to an average error bus 154, via a data output Q. The average error bus 154 is coupled to the absolute error bus, via its input Z.

By using an averaging unit such as the one depicted in FIG. 6, stability can again be maintained once achieved even during rare situations in which an uncertain time reference is received outside the window of expectation W (not to mention errors due to noise being reduced as well). The averaging unit 106 does the former by generating an average error which is less than or equal to WC/2 for an uncertain time reference whose true error is greater than WC/2. Hence, the averaging unit 106 provides an error which makes it appear as if a current uncertain time reference received outside the window of expectation W is actually received within the window of expectation W. As a result, the comparator 105 does not generate a reset output signal, and a periodic time reference will be produced.

Because the signals used and produced by the adaptive flywheel, including the error processing devices, discussed above are primarily digital pulses, like the reset pulse shown in FIGS. 3c and 5c, in order to assure proper timing synchronization of those signals, certain synchronization and delay elements are used in a preferred embodiment of the present invention. Such an embodiment is shown in FIG. 7.

Figure 7:
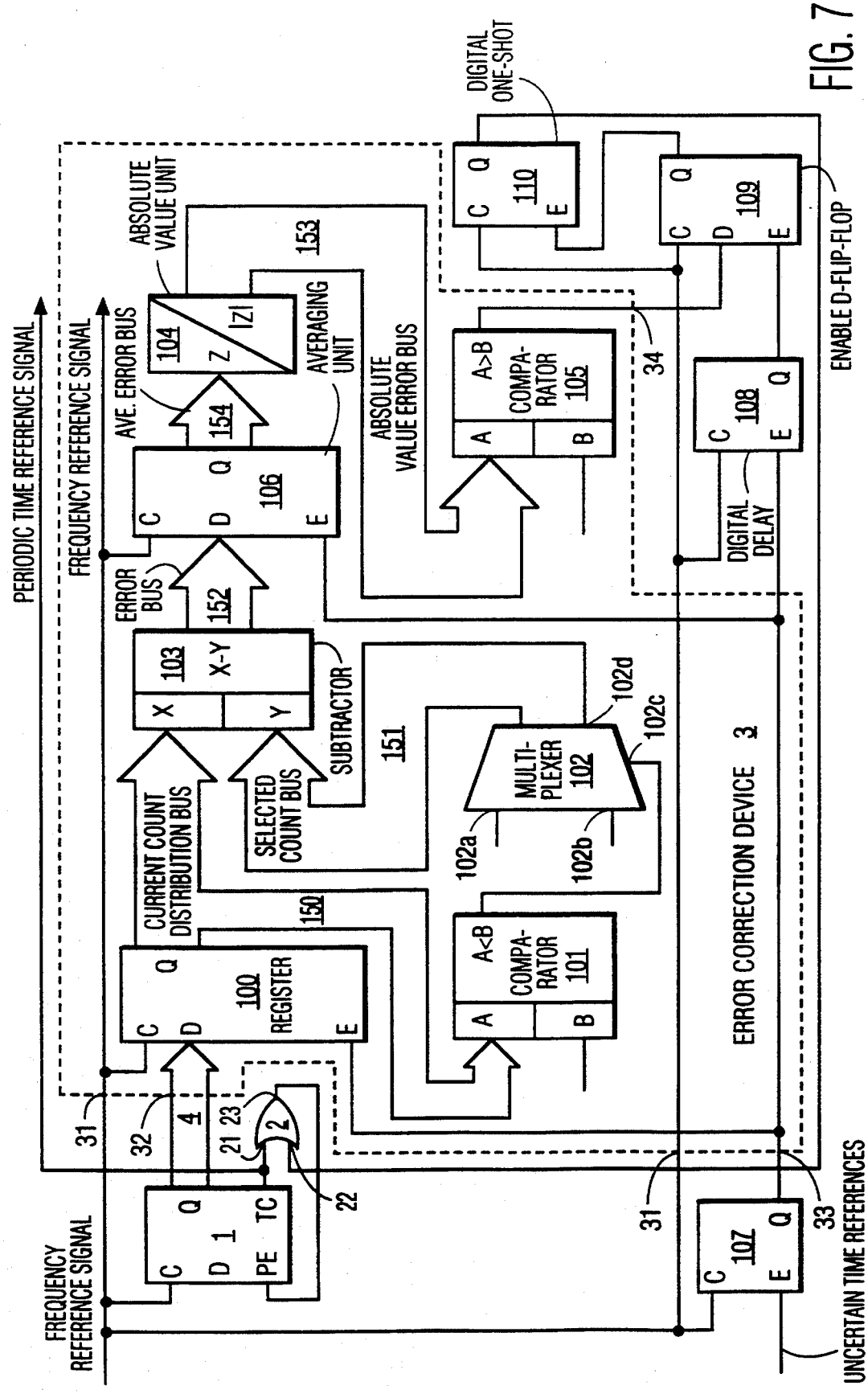

The adaptive flywheel depicted in FIG. 7 includes each of the elements identified in FIGS. 2 and 6, and further comprises two digital one-shots 107 and 110 for effecting the duration of a signal, and a digital delay 108 and an enable D-flip flop 109 for effecting proper delay of enabling signals.

The digital one-shot 107 receives both the frequency reference signal and uncertain time references, via a clock input C and an enable input E, respectively, and provides an output signal at a data output Q indicating that an uncertain time reference has been received by the adaptive flywheel. The digital one-shot 107 acts to make the duration of that output signal equal to the period of the frequency reference signal received by the receiver. The output signal of the digital one-shot 107 is received by the input 33 of the error processing device which is coupled to an enable input E of the digital delay 108 and an enable input E of the register 100.

Besides its enable input E, the digital delay 108 also comprises a clock input C for receiving the frequency reference signal. The digital delay 108 outputs, via a data output Q, an enable signal for the enable D-flip flop 109. That enable signal is output by the D-flip flop only after a predetermine number of frequency reference signals periods have been received, which number corresponds to the time necessary for the error processing device to carry out its operations.

The enable D-flip flop 109 comprises an enable input E for receiving the enable signal provided by the digital delay 108, a clock input C for receiving the frequency reference signal and a data input D for receiving the reset output signal from the output A>B of the comparator 105. The enable D-flip flop 109 outputs, via an data output Q, an indication signal indicating that a reset output signal has been received by it upon the next indication that a frequency reference signal period has occurred (i.e, the next clock signal).

The data output Q of the enable D-flip flop 109 is coupled to the digital one-shot 110, via an enable input E. The digital one-shot 110 also has a clock input C for receiving the frequency reference signal. The D-flip flop operates to assure that the indication signal output by the enable D-flip flop 109 has the same duration as a period of the frequency reference signal received by the adaptive flywheel. The one-shot 110 has a data output Q which is coupled to the input 22 of the OR gate 2 for transferring the indication signal (with a proper duration) to the OR gate 2.

We claim:

1. An apparatus for producing periodic synchronization references, forming a synchronization signal, from uncertain synchronization references which follow one another aperiodically within periodic time intervals and a periodic input signal having a period 1/F, the synchronization signal having a period T which is equal to S/F, where S is an integer, the apparatus comprising:

counter means having a count which can vary from a first count value to a second count value, said counter means being adapted to (a) receive the periodic input signal and increment the count by an increment value for each period 1/F received, (b) provide a periodic synchronization reference when the count reaches the second count value, and (c) reset the count to the first count value when the count reaches the second count value; and error processing means coupled to said counter means, said error processing means being adapted to (a) detect whether an uncertain synchronization reference is received when the count is at a count value other than one of a range of predetermined count values, and (b) cause said counter means to reset the count to the first count value if the uncertain synchronization reference is received when the count is at a count value other than one of the range of predetermined count values.

2. The apparatus as claimed in claim 1 for use in digital television synchronization, wherein the uncertain synchronization references are uncertain time references, the periodic input signal is a frequency reference signal and the synchronization signal is a periodic time reference signal.

3. The apparatus as claimed in claim 2, wherein the frequency reference signal is a pixel frequency, the periodic time reference signal is a frame rate, and S is equal to the number of pixels per frame.

4. The apparatus as claimed in claim 1, wherein said counter means is an L-bit counter, the first count value is $2^L-S$, the second count value is $2^L-1$ and the increment valve is 1, L being an integer equal to the least number of bits required to represent S in binary form.

5. The apparatus as claimed in claim 1, wherein the range of predetermined count values corresponds to a window of expectation for each uncertain time reference, and the window of expectation is greater than or equal to one of the periodic time intervals.

6. The apparatus as claimed in claim 1, wherein the first count value is a minimum count value and the second count value is a maximum count value; and wherein said error processing means comprises:

register means coupled to said counter means for receiving the count when an uncertain synchronization reference is received;

sign means coupled to said register means for (a) determining whether the count when the uncertain synchronization reference is received is higher than or lower than a middle count which is value substantially mid-way between the minimum and maximum count values, and (b) providing an output value which is (i) a derived value derived from the minimum count value when the uncertain synchronization reference is received when the count is lower than the middle count value and (ii) the maximum count value when the uncertain synchronization reference is received when the count is higher than the middle count value;

error means coupled to said register means and said sign means for determining an error corresponding to an absolute value of the difference between the count when the uncertain synchronization reference is received and the output value provided by said sign means; and means coupled to said error means for determining whether the error is greater than WC/2 increment values, and, if so, for supplying a reset signal which causes said counter means to reset the count to the minimum count value, where WC is an integer associated with the number of count values within the range of predetermined count values.

7. The apparatus as claimed in claim 1, wherein the first count value is a maximum count value and the second count value is a minimum count value; and wherein said error processing means comprises:

register means coupled to said counter means for receiving the count when an uncertain synchronization reference is received;

sign means coupled to said register means for (a) determining whether the count when the uncertain synchronization reference is received is higher than or lower than a middle count value which is substantially mid-way between the minimum and maximum count values, and (b) providing an output value which is (i) the minimum count value when the uncertain synchronization reference is received when the count is lower than the middle count value and (ii) a derived value which is derived from the maximum count value when the uncertain synchronization reference is received when the count is higher than the middle count value;

error means coupled to said register means and said sign means for determining an error corresponding to an absolute value of the difference between the count when the uncertain synchronization reference is received and the output value provided by said sign means; and means coupled to said error means for determining whether the error is greater than WC/2 increment values, and, if so, for supplying a reset signal which causes said counter means to reset the count to the maximum count value, where WC is an integer associated with the number of count values within the range of predetermined count values.

8. An apparatus for producing periodic synchronization references, forming a synchronization signal, from uncertain synchronization references which follow one another aperiodically within first periodic time intervals and a periodic input signal having a period 1/F, the synchronization signal having a period T which is equal to S/F, where S is an integer, the apparatus comprising:

counter means having a count which can vary from a first count value to a second count value in a first range of count values, said counter means being adapted to (a) receive the periodic input signal and increment the count by an increment value for each period 1/F received, (b) provide a periodic synchronization reference when the count reaches the second count value, and (c) reset the count to the first count value when the count reaches the second count value; and error processing means coupled to said counter means, said error processing means being adapted no (a) determine an error corresponding to the number of increment values before or after the second count value, whichever has a smaller absolute value, the count is at when an uncertain synchronization reference is received, one sign being used to indicate the number of increment values before the second count value and the opposite sign being used to indicate the number of increment values after the second count value, and (b) cause said counter to reset the count to the first count value if an absolute value of an average of (i) the error determined for the uncertain synchronization reference received and (ii) at least one previously determined error for at least one previously received uncertain synchronization reference is greater than a predetermined number of increment values.

9. The apparatus as claimed in claim 8 for use in digital television synchronization, wherein the uncertain synchronization references are uncertain time references, the periodic input signal is a frequency reference signal and the synchronization signal is a periodic time reference signal.

10. The apparatus as claimed in claim 9, wherein the frequency reference is the pixel frequency, the periodic time reference signal is the frame rate, and S is equal to the number of pixels per frame.

11. The apparatus as claimed in claim 8, wherein most of the uncertain time references follow one another aperiodically within second periodic time intervals which are smaller than the first periodic time intervals; the first range of count values includes a second range of count values which begins with an initial count value which comes before the second count value by the predetermined number of increment values and ends no later than at a final count value which comes after the second count value by the predetermined number of increment values, and which second range of count values corresponds to a window of expectation for each uncertain time reference; and the window of expectation is equal to one of the second periodic time intervals.

12. The apparatus as claimed in claim 8, wherein the first count value is a minimum count value and the second count value is a maximum count value; and said error processing means comprises:

register means coupled to said counter means for receiving the count when an uncertain synchronization reference is received;

sign means coupled to said register means for (a) determining whether the count when the uncertain synchronization reference is received is higher than or lower than a middle count value which is substantially mid-way between the minimum and maximum count values, and (b) providing an output value which is (i) a derived value which is derived from the minimum count value when the uncertain synchronization reference is received when the count is lower than the middle count value and (ii) the maximum count value when the uncertain synchronization reference is received when the count is higher than the middle count value;

error means coupled to said register means and said sign means for determining an error corresponding to the difference between the count when the uncertain synchronization reference is received and the output value provided by said sign means;

averaging means for averaging the error with x previously determined errors for x previously received uncertain synchronization references, where x is an integer, and taking an absolute value thereof to arrive at an average error; and means coupled to said averaging means for determining whether the average error is greater than the predetermined number of increment values, and, if so, for supplying a reset signal to said counter to reset the count to the minimum count value, where the predetermined number of increment values is equal to WC/2 increment values and WC is an integer associated with the number of count values within a second range of count values corresponding to a window of expectation for each uncertain time reference.

13. The apparatus as claimed in claim 8, wherein the first count value is a maximum count value and the second count value is a minimum count value; and said error processing means comprises:

register means coupled to said counter means for receiving the count when an uncertain synchronization reference is received;

sign means coupled to said register means for (a) determining whether the count when the uncertain synchronization reference is received is higher than or lower than a middle count value which is substantially mid-way between the minimum and maximum count values, and (b) providing an output value which is (i) the minimum count value when the uncertain synchronization reference is received when the count is lower than the middle count value and (ii) a derived value which is derived from the maximum count value when the uncertain synchronization reference is received when the count is higher than the middle count value;

error means coupled to said register means and said sign means for determining an error corresponding to the difference between the count when the uncertain synchronization reference is received and the output value provided by said sign means;

averaging means for averaging the error with x previously determined errors for x previously received uncertain synchronization references, where x is an integer, and taking the absolute value thereof to arrive at an average error; and means coupled to said averaging means for determining whether the average error is greater than the predetermined number of increment values, and, if so, for supplying a reset signal to said counter to reset the count to the maximum count value, where the predetermined number of increment values is equal to WC/2 increment values and WC is an integer associated with the number of count values within a second range of count values corresponding to a window of expectation for each uncertain time reference.

14. A method of producing periodic synchronization references, forming a synchronization signal, from uncertain synchronization references which follow one another a periodically within periodic time intervals and a periodic input signal having a period 1/F, the synchronization signal having a period T which is equal to S/F, where S is an integer, the method comprising:

counting from a first count value to a second count value by incrementing a count, which can vary from the first value to the second count value, by an increment value for each period 1/F received, and resetting the count to the first count value when the count reaches the second count value;

determining whether an uncertain synchronization reference is received when the count is at a count value other than one of a range of predetermined count values, and resetting the count to the first count value if the uncertain synchronization reference is received when the count is at a count value other than one of the range of predetermined count values; and providing a periodic synchronization reference when the count reaches the second count value.

15. The method as claimed in claim 14 for use in digital television synchronization, wherein the uncertain synchronization references are uncertain time references, the periodic input signal is a frequency reference signal and the synchronization signal is a periodic time reference signal.

16. The method as claimed in claim 14, wherein the range of predetermined count values corresponds to a window of expectation for each uncertain time reference, and the window of expectation is greater than or equal to one of the periodic time intervals.

17. A method of producing periodic synchronization references, forming a synchronization signal, from uncertain synchronization references which follow one another a periodically within first periodic time intervals and a periodic input signal having a period 1/F, the synchronization signal having a period T which is equal to S/F, where S is an integer, the method comprising:

counting from a first count value to a second count value in a first range of count values by incrementing a count, which can vary from the first count value to the second count value, by an increment value for each period 1/F received, and resetting the count to the first count value when the count reaches the second count value;

determining an error corresponding to the number of increment values before or after the second count value, whichever has a smaller absolute value, the count is at when an uncertain synchronization reference is received, one sign being used to indicate the number of increment values before the second count value and the opposite sign being used to indicate the number of increment values after the second count value, and resetting the count to the first count value if an absolute value of an average of (i) the error determined for the uncertain synchronization reference received and (ii) at least on previously determined error for at least one previously received uncertain synchronization reference is greater than a predetermined number of increment values; and providing a periodic synchronization reference when the count reaches the second count value.

18. The method as claimed in claim 17 for use in digital television synchronization, wherein the uncertain synchronization references are uncertain time references, the periodic input signal is a frequency reference signal and the synchronization signal is a periodic time reference signal.

19. The method as claimed in claim 17, wherein most of the uncertain time references follow one another aperiodically within second periodic time intervals which are smaller than the first periodic time intervals; the first range of count values includes a second range of count values which begins with an initial count value which comes before the second count value by the predetermined number of increment values and ends no later than at a final count value which comes after the second count value by the predetermined number of increment values, and which second range of count values corresponds to a window of expectation for each uncertain time reference; and the window of expectation is equal to one of the second periodic time intervals.

* * * * *